(12) United States Patent
Park et al.

(10) Patent No.: US 7,030,006 B2
(45) Date of Patent: Apr. 18, 2006

(54) METHOD FOR FORMING CONTACT HOLE AND SPACER OF SEMICONDUCTOR DEVICE

(75) Inventors: Sung-Chan Park, Ichon-shi (KR); Phil-Goo Kong, Ichon-shi (KR); Kuk-Han Yoon, Ichon-shi (KR)

(73) Assignee: Hynix Semiconductor Inc, Ichon-shi (KR)

( * ) Notice: Subject to any disclaimer, the term of this patent is extended or adjusted under 35 U.S.C. 154(b) by 0 days.

(21) Appl. No.: 09/998,303

(22) Filed: Dec. 3, 2001

(65) Prior Publication Data

US 2002/0084473 A1 Jul. 4, 2002

(30) Foreign Application Priority Data

Dec. 11, 2000 (KR) ................. 2000-75286

(51) Int. Cl.
*H01L 21/4763* (2006.01)

(52) U.S. Cl. .............. 438/630; 438/595; 438/637; 438/669; 438/672

(58) Field of Classification Search ........... 438/630, 438/637–640, 667–669, 672–673, 675, 595, 438/623–624
See application file for complete search history.

(56) References Cited

U.S. PATENT DOCUMENTS

| | | | | |
|---|---|---|---|---|
| 5,219,793 | A | * | 6/1993 | Cooper et al. ........ 148/DIG. 20 |
| 5,318,925 | A | * | 6/1994 | Kim .......................... 438/253 |
| 5,491,109 | A | * | 2/1996 | Kim .......................... 438/624 |
| 5,801,443 | A | * | 9/1998 | Ohno ......................... 257/758 |
| 6,159,842 | A | * | 12/2000 | Chang et al. .................. 216/2 |
| 6,329,695 | B1 | * | 12/2001 | Duane et al. ............... 257/408 |
| 6,331,480 | B1 | * | 12/2001 | Tsai et al. .................... 438/624 |
| 6,551,894 | B1 | * | 4/2003 | Kohyama et al. ........... 438/618 |
| 6,562,680 | B1 | * | 5/2003 | Asakawa .................... 438/257 |
| 6,649,508 | B1 | * | 11/2003 | Park et al. .................. 438/618 |
| 2001/0036730 | A1 | * | 11/2001 | Kim .......................... 438/689 |
| 2002/0098699 | A1 | * | 7/2002 | Chern et al. ................ 438/692 |

* cited by examiner

*Primary Examiner*—Thanh Nguyen
(74) *Attorney, Agent, or Firm*—Finnegan, Henderson, Farabow, Garrett & Dunner, L.L.P.

(57) ABSTRACT

Disclosed is a contact hole forming method capable of reducing parasitic capacitance between a conductive layer patterns, preventing bad contacts caused by mask misalignment and effectively filling an interlayer insulating layer between the conductive layer patterns. The method including forming many conductive layer patterns on a substrate, forming an interlayer insulating layer on a resulting structure where the conductive layer patterns are completed, exposing a conductive layer pattern which at least one sidewall of a contact region between conductive layer patterns is neighboring the contact region, and forming an insulating spacer on the sidewall of the exposed conductive layer pattern.

9 Claims, 14 Drawing Sheets

METHOD FOR FORMING CONTACT HOLE AND SPACER OF SEMICONDUCTOR DEVICE

DESCRIPTION OF THE INVENTION

Field of the Invention

The present invention relates to semiconductor devices; more particularly, to methods for forming a contact hole for reducing parasitic capacitance between conductive layer patterns, preventing bad contact caused by a mask misalignment, and effectively filling an interlayer insulating layer between the conductive patterns.

DESCRIPTION OF THE RELATED ART

With increases in integration of semiconductor devices, a self-align contact (hereinafter, referred to as a SAC) etching method has been used in a conventional storage node contact process.

Hereinafter, problems with a conventional contact hole forming method will be described in detail referring to the accompanying drawings.

Figure 1:
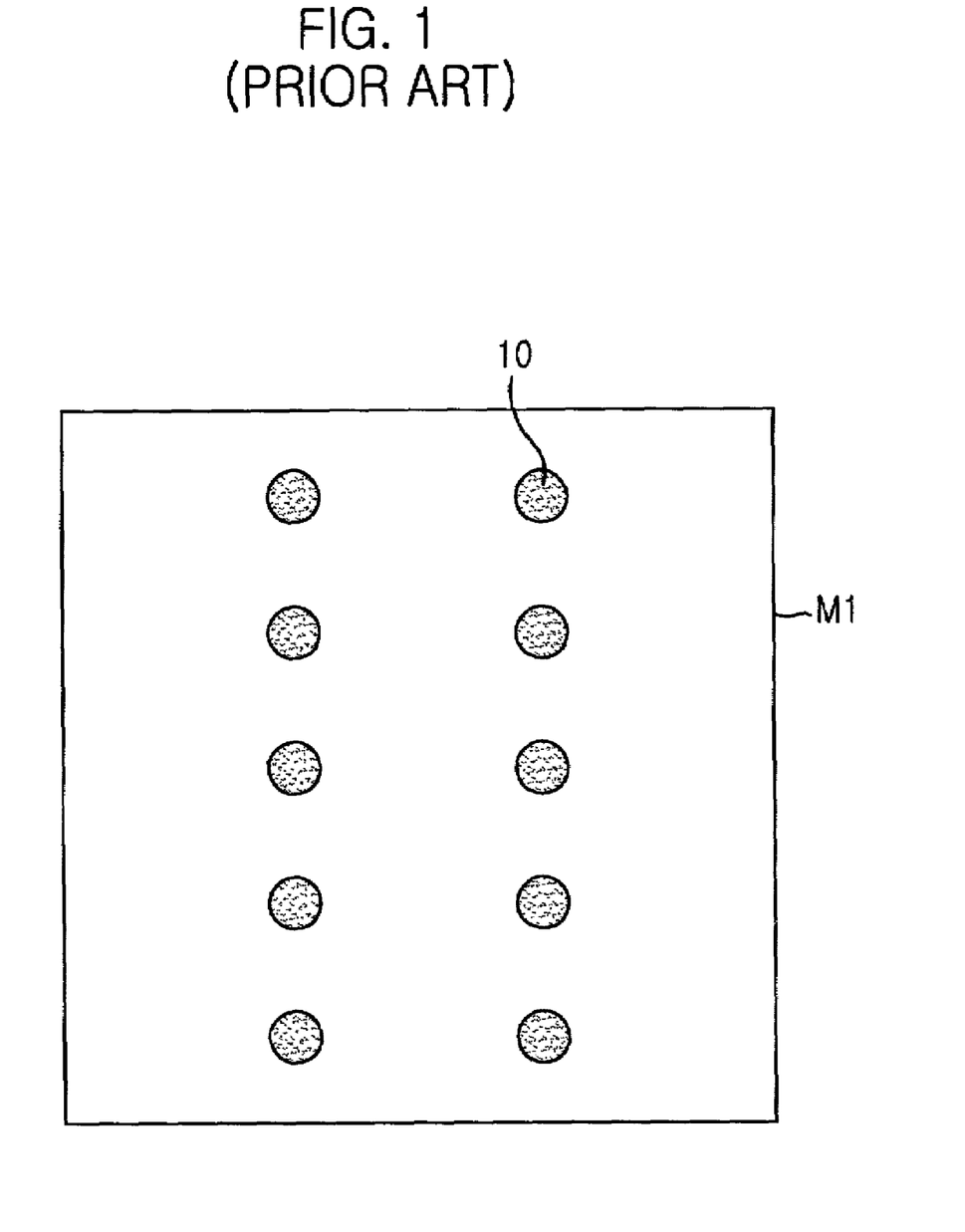
FIG. 1 is a plan view illustrating a conventional mask for forming a hole shape storage node contact hole.

A method for forming a conventional contact hole for a storage node contact using a mask (M1) that defines a contact hole 10, as shown in FIG. 1, is described with reference to FIGS. 2A to 2E.

Figure 2A:
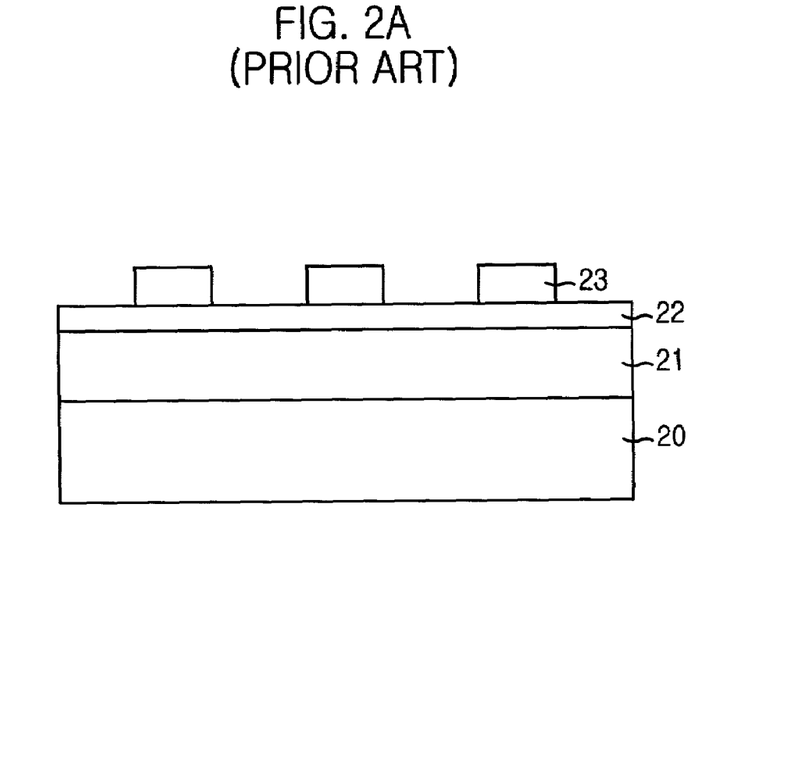
FIGS. 2A to 2E are cross-sectional views showing a conventional hole shaped storage node contact hole formation process.

As shown in FIG. 2A, a conductive layer 21 and a mask layer 22 for a bit line are formed with tungsten on a semiconductor substrate 20 where a lower structure formation is completed, and first photoresist patterns 23 which define a bit line pattern are formed on mask layer 22. Mask layer 22 is used for protecting a bit line in a contact hole forming process by etching an interlayer oxide layer, and is formed of a nitride layer which has a different etching rate than an oxide layer.

Figure 2B:
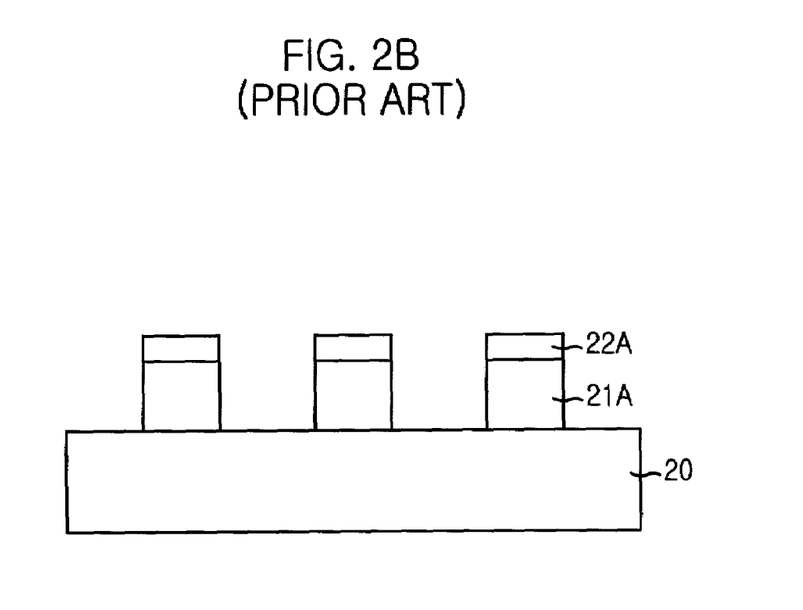

Subsequently, mask layer 22 and conductive layer 21 are selectively etched by using first photoresist layer patterns 23 as etching masks. First photoresist layer patterns 23 are removed after forming mask patterns 22A and bit lines 21A, as shown in FIG. 2B.

Figure 2C:
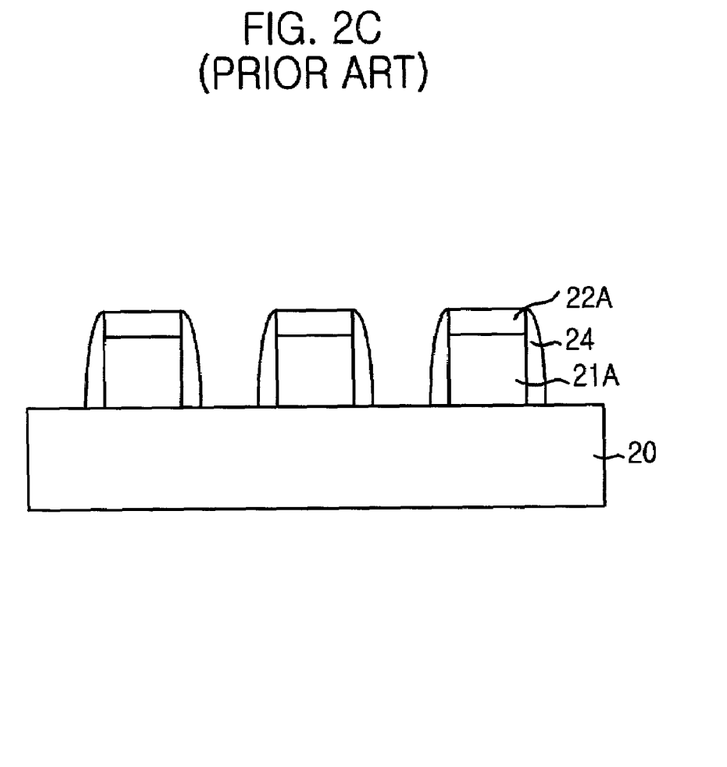

As shown in FIG. 2C, spacers 24 are formed on sidewalls of the mask patterns 22A and the bit lines 21A. Spacers 24 are used as insulation between bit lines 21A, and are formed by depositing a nitride layer and by applying a blanket etching process to the deposited nitride. Preferably, the deposited nitride for spacers 24 is selected based on an etching rate required to form contact holes with an etchant. Typically, such a selective etching rate is obtained between a nitride layer and an oxide layer.

Figure 2D:
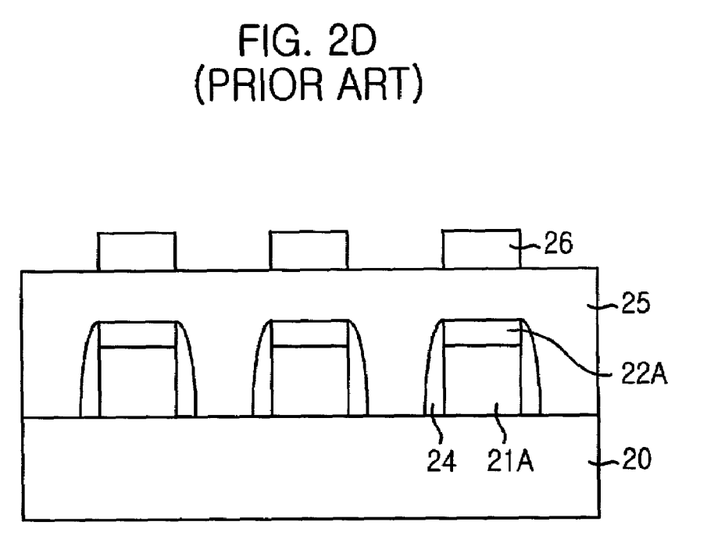

As shown in FIG. 2D, an interlayer oxide layer 25 is formed on the resulting structure, and second photoresist patterns 26, which define the contact hole forming regions, are formed on interlayer oxide layer 25 by using a mask as shown in FIG. 1.

Figure 2E:
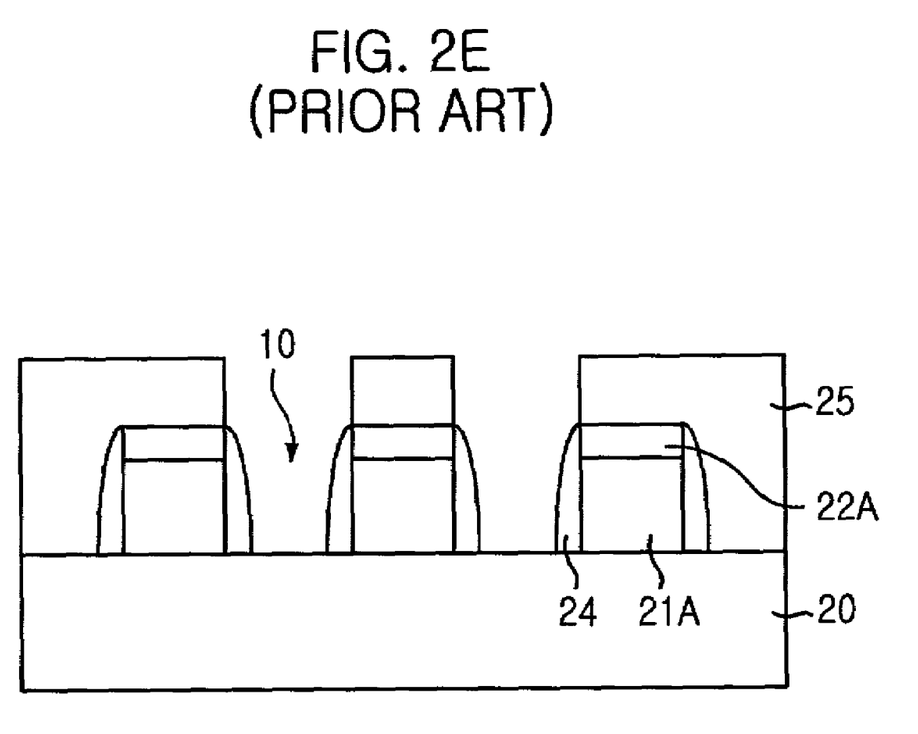

As shown in FIG. 2E, interlayer oxide layer 25 is etched by using second photoresist patterns 26 as etching masks, thereby to form contact holes 10 that expose contact regions between spacers 24, i.e., semiconductor substrate 20.

Figure 3A:
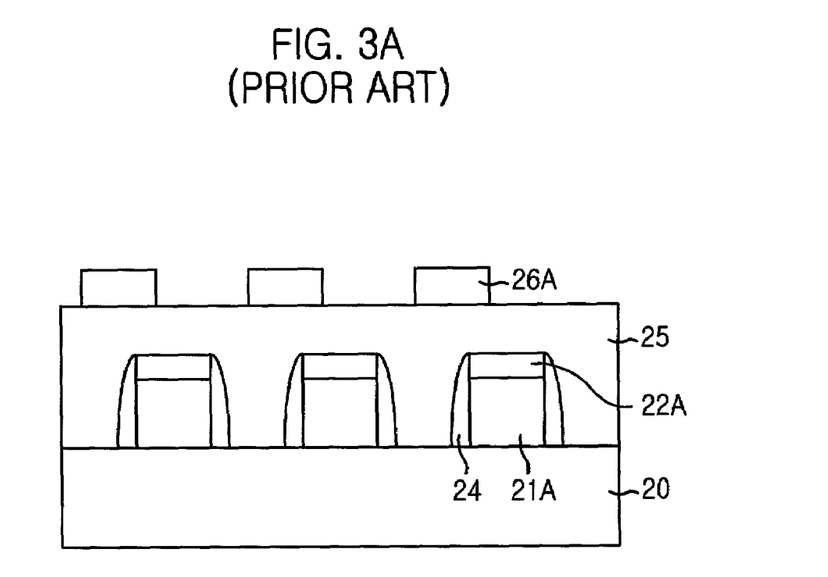
FIGS. 3A and 3B are cross-sectional views showing a problem of mask misalignment in a conventional hole shaped storage node contact hole formation process.
Figure 3B:
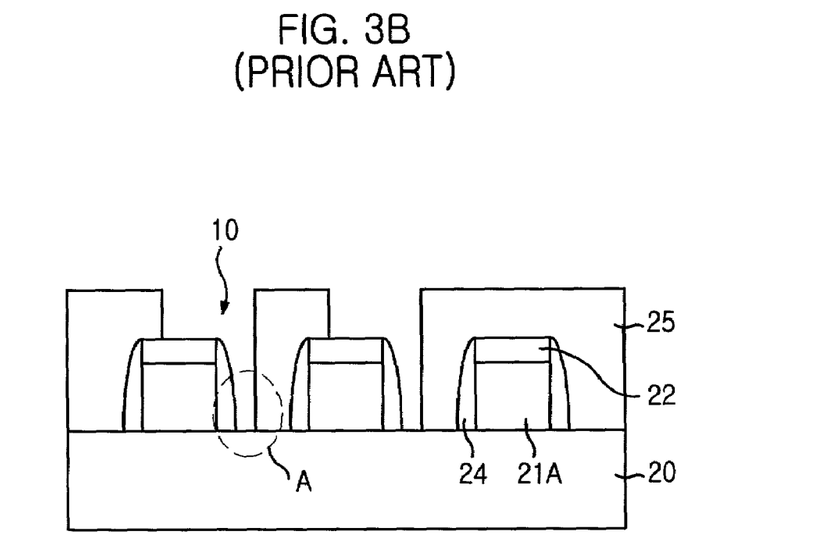

When the aforementioned SAC etching method using a contact hole mask is performed in a high integration device manufacturing process, photomask misalignment can result. As shown in FIG. 3A, if the photomask is deviated from its course, causing a misalignment of photoresist pattern 26A which defines the contact hole, the etching process is terminated on mask layer 22A and spacer 24, and a bottom portion of contact hole 10 is exposed badly, shown at 'A' in FIG. 3B. With highly integrated capacitor devices having narrow gaps between bit lines 21A, the problems caused by the misalignment become serious.

To prevent misalignment of a mask, a contact hole mask in the shape of a straight line is provided instead of a hole shape.

Figure 4:
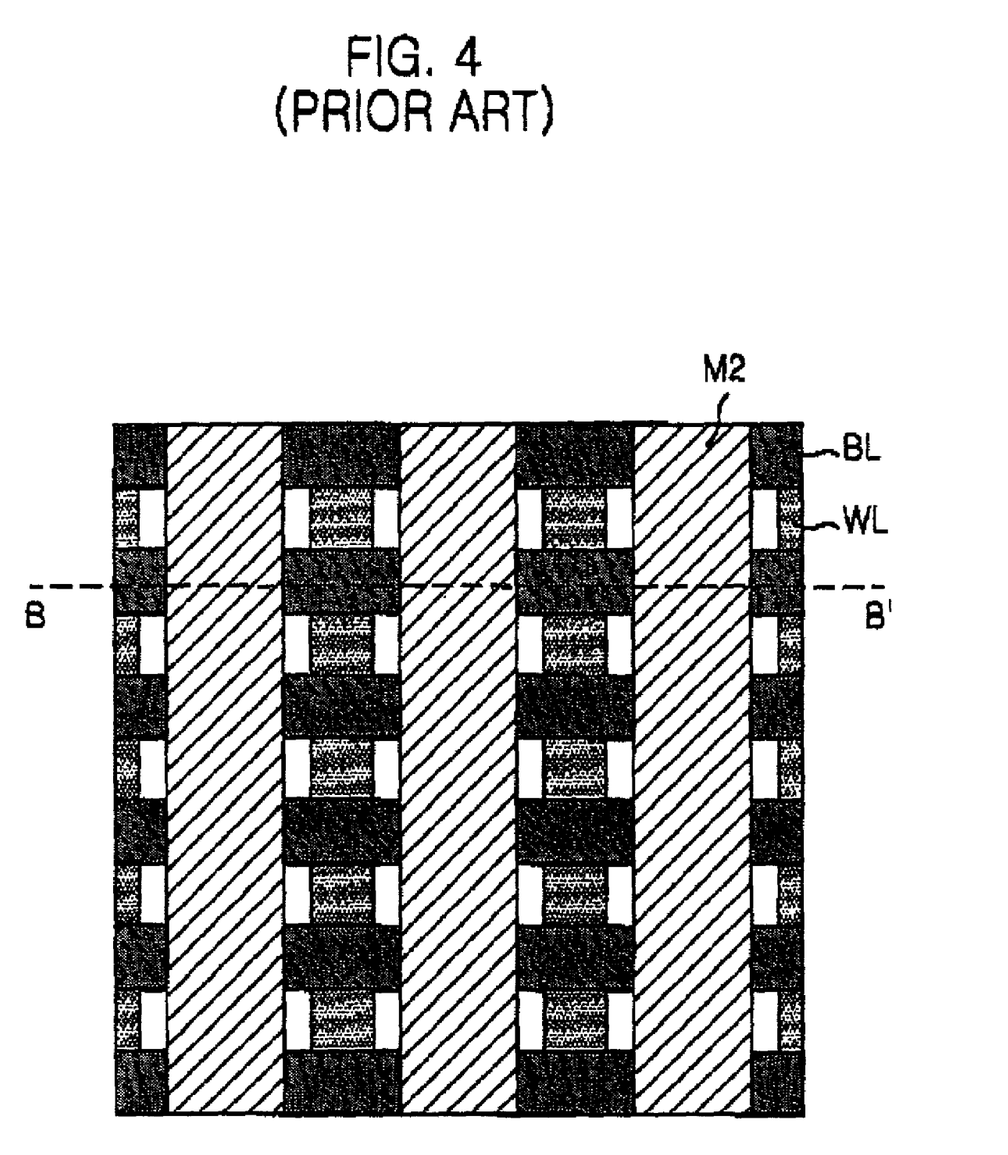
FIG. 4 is a plan view showing an arrangement of conventional straight line shaped storage node contact holes, bit lines and word lines.

A conventional straight line shape of a storage node contact hole formation method using a straight line shape of mask M2, which is parallel to a word line WL and vertical to a bit line BL, is shown in FIG. 4, and cross-sectional views taken along the broken line B—B' are described in to FIGS. 5A to 5E.

Figure 5A:
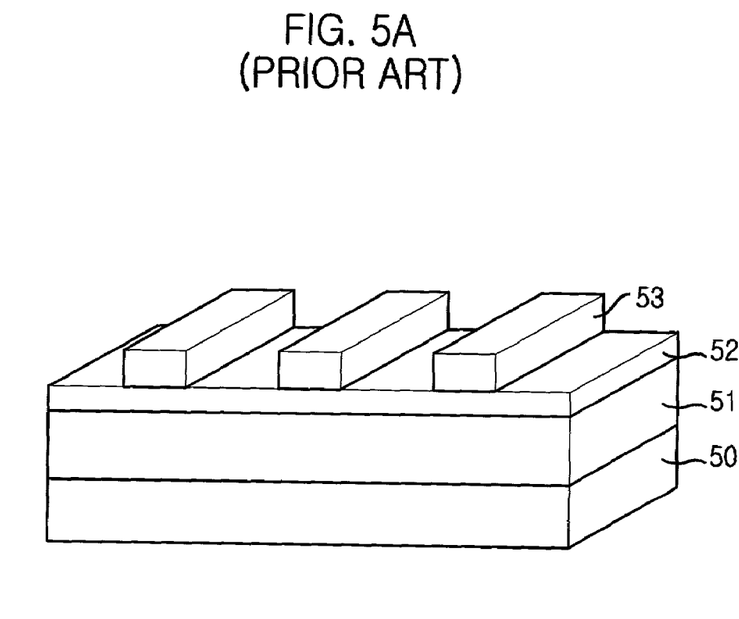
FIGS. 5A to 5E are perspective views showing a conventional straight line shaped storage node contact hole formation process.

As shown in FIG. 5A, a conductive layer 51, such as a tungsten layer, and a mask layer 52 for forming a bit line are, in this order, formed on a semiconductor substrate 50 where a predetermined lower structure is completed. Then, first photoresist patterns 53, which define a bit line pattern, are formed on mask layer 52. Mask layer 52 is used to protect the bit line when etching an interlayer insulating oxide layer to form contact holes. Mask layer 52 is formed with a nitride layer which is different from an oxide layer with regard to their etching rates.

Figure 5B:
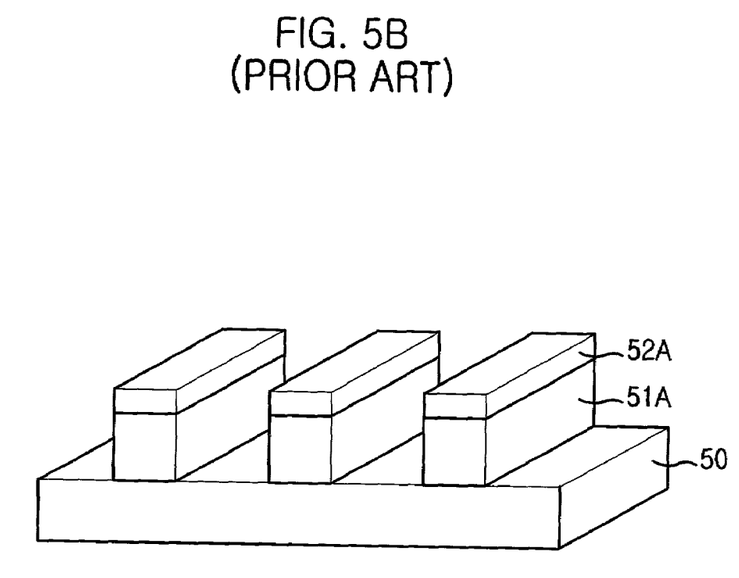

Mask layer 52 and conductive layer 51 are selectively etched by using first photoresist layer patterns 53 as etching masks. First photoresist layer patterns 53 are removed with the formation of mask nitride patterns 52A and bit lines 51A, as shown in FIG. 5B.

Figure 5C:
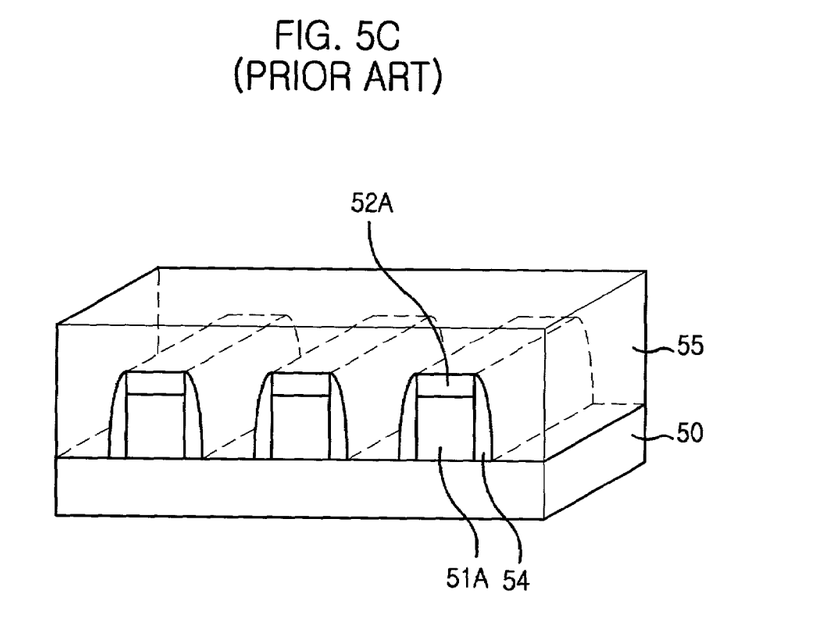

Referring to FIG. 5C, spacers 54 are formed on sidewalls of mask nitride patterns 52A and bit lines 51A, and an interlayer insulation oxide layer 55 is formed on the resulting structure. Spacers 54 are used as insulation between the neighboring bit lines 51A. Spacers 54 are formed by applying a blanket etching process to a nitride layer which is different from an oxide layer with regard to their etching rates.

Figure 5D:
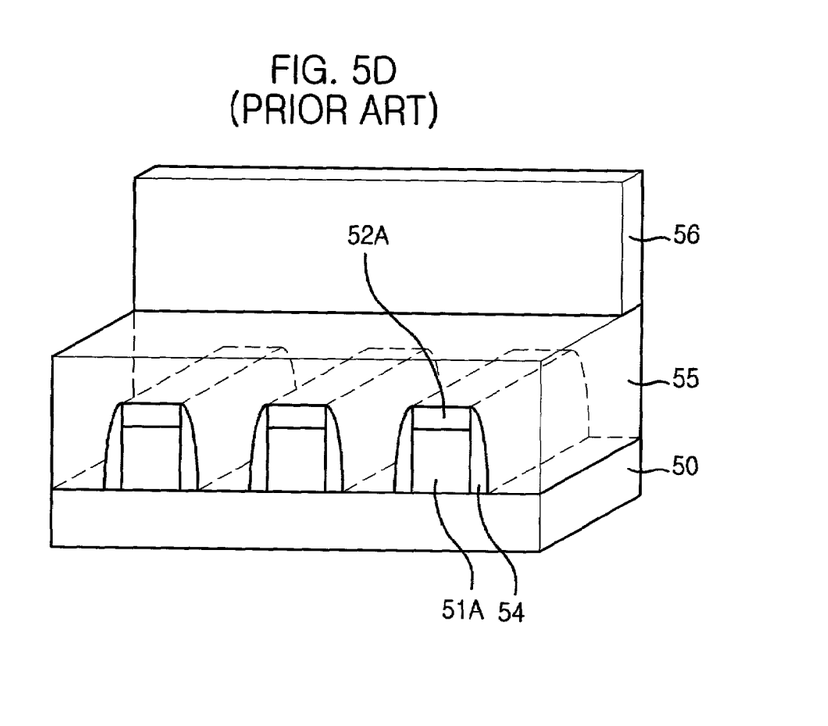

Referring to FIG. 5D, a second photoresist layer pattern 56 defining a contact hole region by using the straight line shape of mask (M2), as shown in FIG. 4, is formed on interlayer insulation oxide layer 55.

Figure 5E:
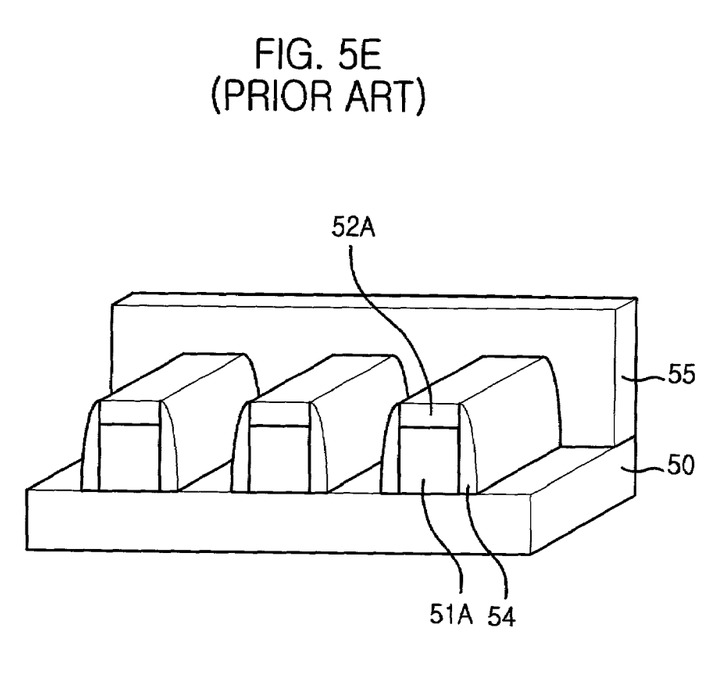

Subsequently, referring to FIG. 5E, interlayer insulating oxide layer 55 is etched by using second photoresist layer pattern 56 as an etching mask to form contact regions between spacers 54, for example, whereby contact holes which expose semiconductor substrate 50 are formed.

The straight line shaped mask has a larger overlap margin than the hole shape mask so that mask misalignment problems may be solved. However, bad filling problems of the high density plasma (HDP) oxide layer which forms the interlayer insulating layer may not be solved.

The more the integration of devices is increased, the narrower a conductive layer pattern gap is, so that gap-fill characteristics of an interlayer insulating layer worsen.

Figure 6:
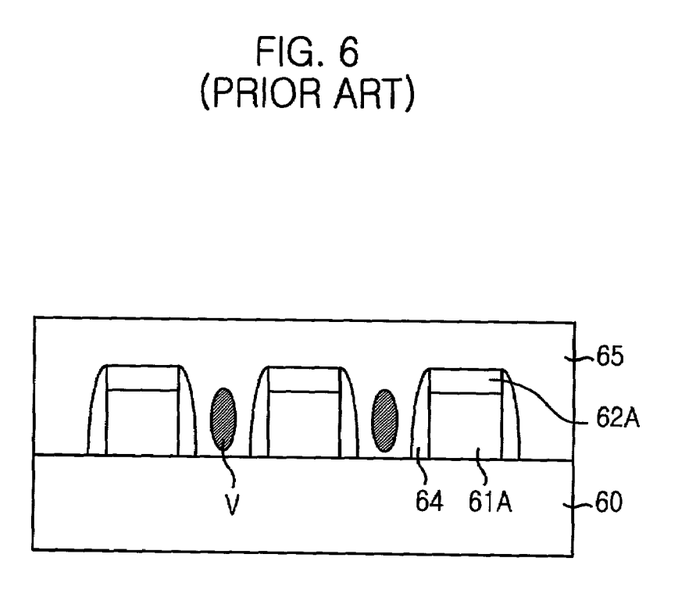
FIG. 6 is a cross-sectional view showing voids generated within an interlayer insulating layer between neighboring bit lines in an interlayer insulating layer with a conventional semiconductor manufacturing process.

With progress in integration, the gap between the bit lines narrows so that the HDP oxide layer, which forms the interlayer insulating layer, may not fill the gap between the bit lines. This filling problem in the interlayer oxide layer is brought out as shown in FIG. 6. That is, voids V are generated within HDP oxide layer 65 between sidewall spacers 64 of neighboring bit lines 61A. In FIG. 6, reference numerals 60 and 62A denote a semiconductor substrate and mask patterns, respectively.

In the HDP oxide layer, when the aspect ratio of the void is over 4.0, that is, when the height of void is four times or more greater than the width thereof, voids are generated. To solve the problem caused by bad filling of the interlayer insulating layer, a conventional pre-polysilicon plug (hereinafter, referred to as a PPP) forming method has been used and will be described in detail below.

Figure 7A:
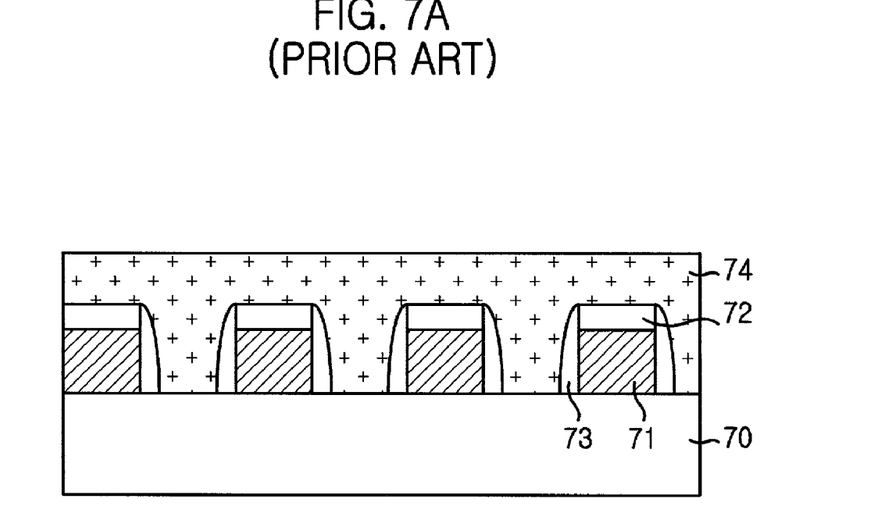
FIGS. 7A to 7D are cross-sectional views showing a conventional pre-plug formation process.

First, as shown in FIG. 7A, bit lines 71, mask patterns 72, and spacers 73 are formed on a semiconductor substrate 70 having a predetermined bottom structure, and a polysilicon layer 74 is formed on the resulting structure.

Figure 7B:
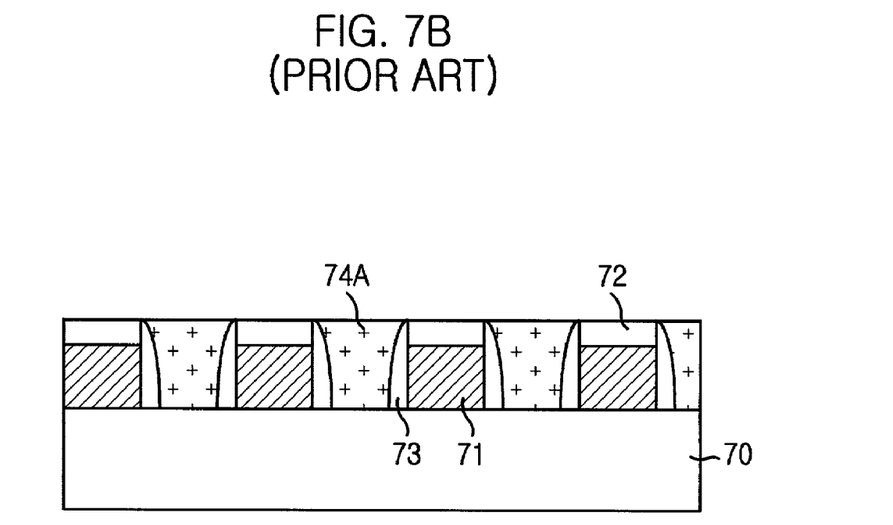

As shown in FIG. 7B, the polysilicon layer is subjected to an etch-back or polishing process until upper surfaces of mask patterns 72, which cover bit lines 71, are exposed, thereby forming PPP layers 74A.

Figure 7C:
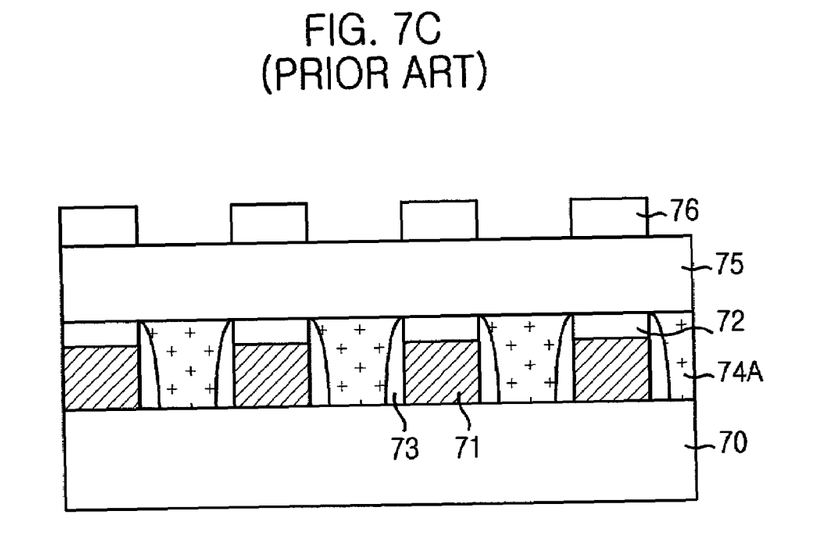

As shown in FIG. 7C, an interlayer insulating layer 75 is formed on the resulting structure and photoresist patterns 76, which defines contact holes, are formed on interlayer insulating layer 75.

Figure 7D:
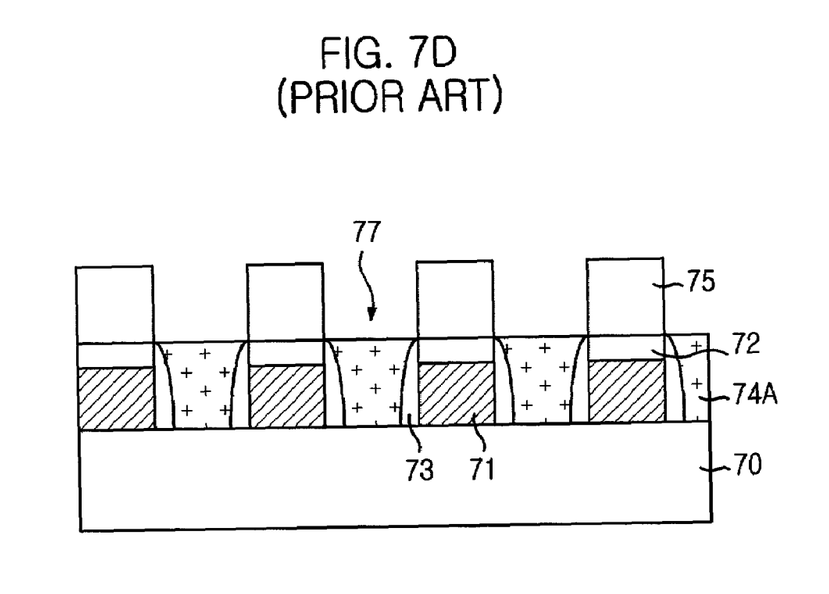

Subsequently, as shown in FIG. 7D, contact holes 77, which expose PPP layers 74A, are formed by selectively etching interlayer insulating layer 75 using photoresist pattern 76 as an etching mask, and then photoresist pattern 76 is removed.

The conventional PPP method may reduce the depth of a void so that an interlayer insulating layer is satisfactorily filled. However, the method may add processing steps such as a polysilicon layer deposition and an etch-back process.

The above-mentioned straight line shaped contact hole method and the PPP method may solve mask misalignment problems caused by contact hole formation in a hole shape, and void generation problems within the interlayer insulating layer, respectively. However, the above-mentioned methods may not solve increases in bit line parasitic capacitance.

When an electrical signal is applied to a specific bit line, parasitic capacitance induces an electrical signal in adjacent bit lines. This parasitic capacitance increases when bit lines are wrapped with a nitride layer, which has a large dielectric constant for the SAC etching. To solve the parasitic capacitance problem, the bit line may be covered with material, such as an oxide layer, that has a small dielectric constant. But in this case, selective etching ratios, which are used for interlayer insulation, may not be obtained, so that the SAC etching process can not be carried out.

SUMMARY OF THE INVENTION

The present invention provides a manufacturing method for contact hole and a spacer formation in semiconductor devices capable of preventing a bad contact followed by mask misalignment and voids generated within an interlayer insulating layer between neighboring conductive patterns, and reducing parasitic capacitance between conductive patterns.

In accordance with one aspect of the present invention, a semiconductor device manufacturing method comprises forming many conductive patterns on a substrate, thereby forming a resulting structure, forming an insulating interlayer on the resulting structure, exposing contact regions between the neighboring conductive layer patterns, and forming an insulating spacer on the sidewall of the conductive layer pattern.

In accordance with another aspect of the present invention, a semiconductor device manufacturing method comprises forming many conductive layer patterns on a substrate, forming a resulting structure, forming an interlayer insulating layer on the resulting structure, and exposing contact regions between the neighboring conductive layer patterns by selectively etching the interlayer insulating layer and, at the same time, forming a spacer leaving the interlayer insulating layer on the sidewall of the conductive layer patterns.

According to the present invention, an interlayer insulation layer is deposited just after forming a conductive layer pattern, such as a gate electrode and a bit line, and a contact hole is formed by carrying out an etching process through a mask pattern which defines at least one contact hole pattern selected from a group comprising a straight line shaped, a T-shaped pattern, and an I-shaped pattern, or forming an insulating spacer on sidewalls of the conductive layer patterns during a contact hole formation process, thereby forming contact holes and spacers between neighboring conductive layer patterns.

BRIEF DESCRIPTION OF THE DRAWINGS

Other features and aspects of the invention will become apparent from the following description of the embodiments with reference to the accompanying drawings, in which.

DETAILED DESCRIPTION OF THE PREFERRED EMBODIMENTS

A semiconductor device manufacturing method according to the present invention will now be described in detail with reference to the accompanying drawings.

FIGS. 8A to 8F are perspective views showing a straight line shaped storage node contact hole formation process in accordance with the present invention.

Figure 8A:
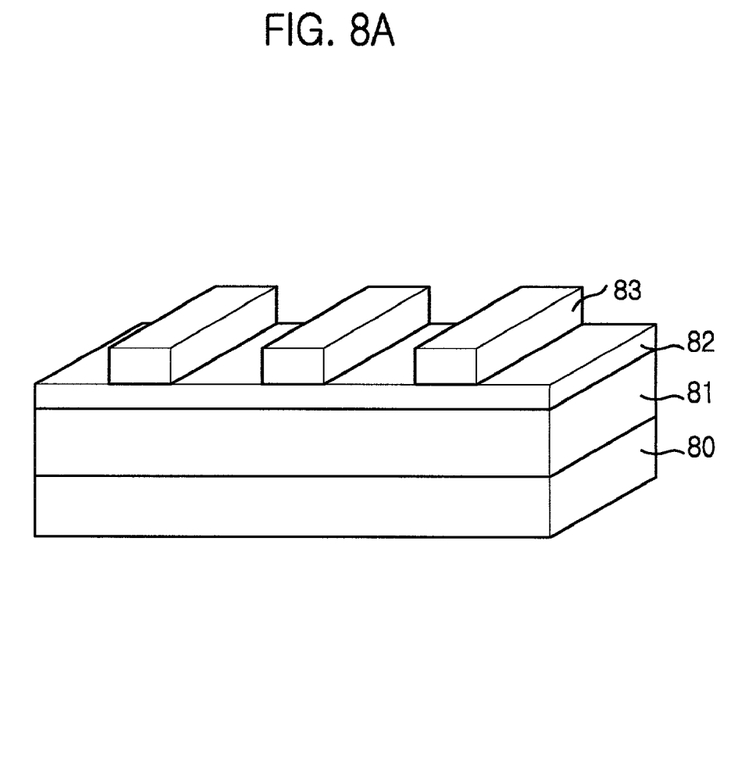
FIGS. 8A to 8F are perspective views showing a straight line shaped storage node contact hole formation process in accordance with the present invention.

Referring to FIG. 8A, a conductive layer 81 for bit lines or gate electrodes is made of any one selected from the group consisting of W, $WSi_x$, $TiSi_x$, Al, and Cu and formed on a semiconductor substrate 80 where a predetermined lower structure, such as a well or a field oxide layer, is completed. A mask layer 82 having a thickness of 400 Å to 5000 Å is formed on conductive layer 81, and first photoresist layer patterns 83, which define bit lines or gate electrode patterns, are formed. Mask layer 82 is used to protect the bit lines or gate electrode patterns. When contact hole formation is carried out by etching an interlayer insulating layer, mask layer 82 is formed of a nitride layer which is different from an oxide layer in their etching rates. For example, when the interlayer insulating layer is formed of an oxide layer, mask layer 82 is formed with SiN or SiON. When the interlayer insulating layer is formed with a polymer having a low dielectric constant layer, mask layer 82 is formed with oxide materials. It is possible to form mask layer 82 without relying on the etching characteristics of conductive layer 81.

Figure 8B:
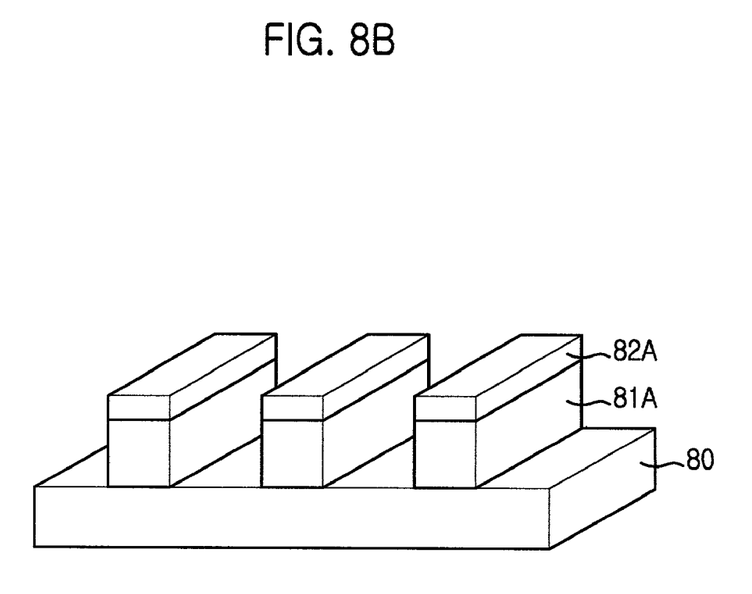

Subsequently, mask nitride layer 82 and conductive layer 81 are selectively etched by using first photoresist layer patterns 83 as etching masks. Then the first photoresist layer patterns 83 are removed, thereby forming mask nitride layer patterns 82A and conductive layer patterns 81A, as shown in FIG. 8B.

Figure 8C:
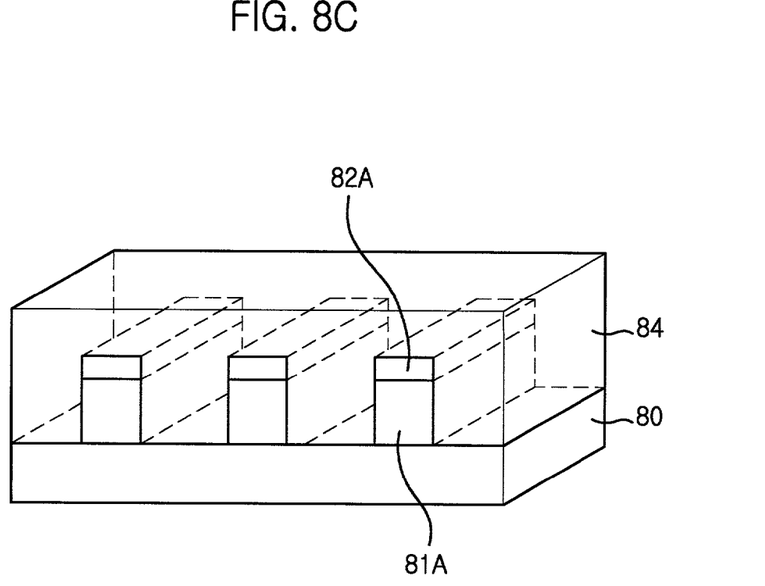

Referring to FIG. 8C, an interlayer insulating layer 84 is formed on the resulting structure having a thickness of 500 Å to 10000 Å with an oxide layer or a low dielectric material which has a dielectric constant below 3.5, such as SiLK (a polymer produced by Dow Chemical Company), FLARE (a polymer produced by Honeywell International Inc.), FOX (a flowable oxide by Dow Corning Corp.), Hydrogen silsesquioxane (HSQ), or benzocyclobutene (BCB).

Figure 8D:
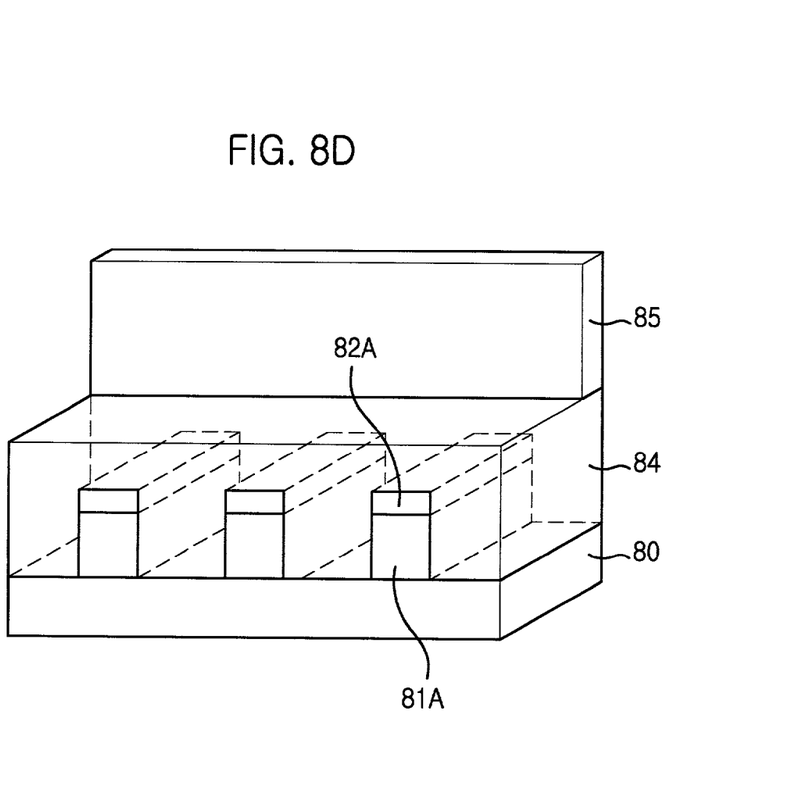

Referring to FIG. 8D, a second photoresist layer pattern 85, which defines contact hole regions, is formed on interlayer insulating layer 84. Second photoresist layer pattern 85 is formed with a mask layer formed by a pattern selected from the group consisting of straight line shaped, a T-shaped, and an I-shaped patterns.

Figure 8E:
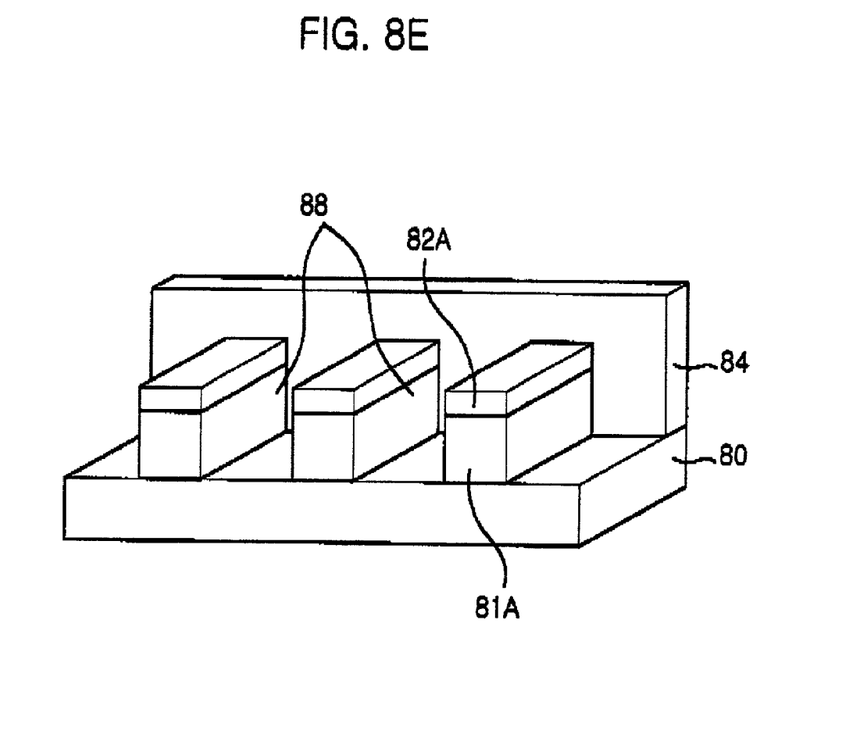

Next, interlayer insulating layer 84 is etched by using second photoresist layer pattern 85 as an etching mask, and second photoresist layer pattern 85 is then removed. According to the above-mentioned process, contact holes 88, which expose semiconductor substrate 80 are formed between neighboring conductive layer patterns 81A, as shown in FIG. 8E.

At this time, a plasma etching reactor having a high density greater than $10^{12}/cm^2$ or a middle density of $10^{11}/cm^2$ to $10^{12}/cm^2$ is used, and a pressure of the etching reactor may be 1 mTorr to 100 mTorr.

Where interlayer insulating layer 84 is an oxide layer, it is etched by a mixture of Ar, C, and F, such as a mixture gas of $Ar/C_4F_8/CH_2F_2$, $Ar/C_4F_8/O_2$, $Ar/C_4F_8/CH_3F$, $Ar/C_4F_8/CHF_3$, or $Ar/C_5F_8/O_2$. If interlayer insulating layer 84 is a polymer, it is etched by a mixed gas selected from Ar, $O_2$, $N_2$, $H_2$, $CH_4$, $C_2H_4$, and $C_xF_y$.

Figure 8F:
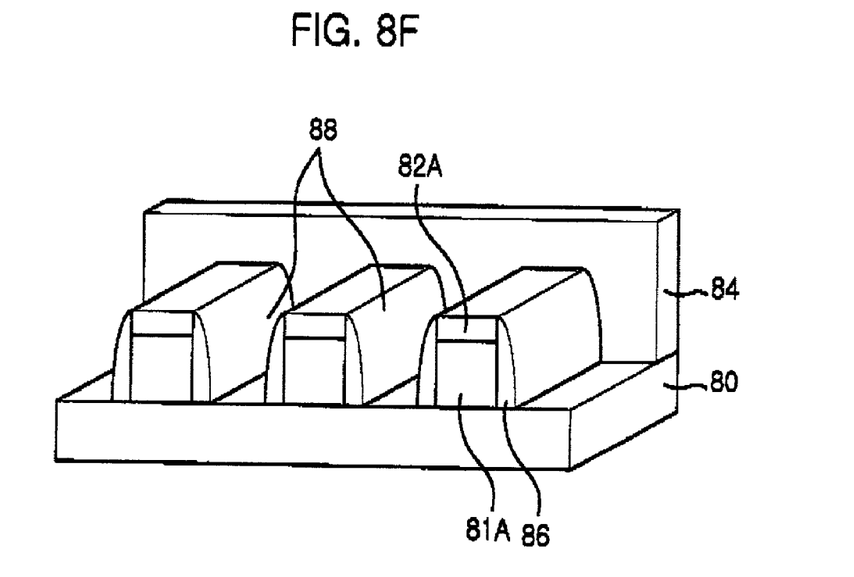

Referring to FIG. 8F, spacers 86 are formed on sidewalls of mask pattern 82A and conductive layer patterns 81A. Spacers 86 are formed by depositing an insulating layer, such as an oxide layer, at a thickness of 50 Å to 2000 Å, on the resulting structure and applying blanket etching to the insulating layer. In the course of etching interlayer insulating layer 84 for forming the contact holes 88, spacers 86 may be formed by leaving the interlayer insulating layer 84 on sidewalls of conductive layer pattern 81A.

According to the present invention, an interlayer insulating layer is formed before forming spacers where there are relatively large gaps between conductive layer patterns, such as bit lines. Accordingly, since the aspect ratio of the spaces between the bit lines reduces the insulating layer, such as a HDP oxide layer, can be deposited without any void. Also, by using contact hole forming masks, such as a straight line shaped, a T-shaped, or an I-shaped patterns, bad contacts caused by mask misalignment are prevented, as compared with the use of a contact hole forming mask having a hole shape. Besides, being different from conventional methods, an interlayer insulating layer is deposited and etched before forming spacers on sidewalls of the conductive layer patterns, thereby forming spacers with an oxide layer without considering a selective etching rate between an interlayer insulating layer and the spacer layer. Also, parasitic capacitance between neighboring conductive layer patterns decreases.

Although the preferred embodiments of the invention have been disclosed for illustrative purposes, those skilled in the art will appreciate that various modifications, additions and substitutions are possible, without departing from the scope and spirit of the invention as set forth in the accompanying claims.

What is claimed is:

1. A method for forming contact openings between bit line patterns, the method comprising the steps of:
    a) forming bit line patterns over a substrate;
    b) forming an interlayer insulating layer over the substrate and the bit line patterns;
    c) etching the interlayer insulating layer by using the bit line patterns and an etching mask defining a straight line shape as a mask, thereby forming at least one straight line shaped self-aligned contact opening between neighboring bit line patterns; and
    d) forming spacers on sidewalls of the bit line patterns only exposed through the contact opening.

2. The method of claim 1, wherein the interlayer insulating layer is formed of a material having a dielectric constant less than 3.5.

3. The method of claim 2, wherein in step b), the interlayer insulating layer is formed of an oxide layer.

4. The method of claim 3, where in step c), the interlayer insulating layer is etched with a gas mixture including Ar, C, and F.

5. The method of claim 4, wherein in step c), the interlayer insulating layer is etched at a pressure of 1 mTorr to 100 mTorr.

6. The method of claim 1, wherein top surfaces of the bit line patterns are covered with a layer selected from a group consisting of a silicon nitride layer, a silicon oxynitride layer, and an oxide layer.

7. The method of claim 2, wherein in step b), the interlayer insulating layer is formed of a polymer.

8. The method of claim 7, wherein in step c), the interlayer insulating layer is etched by using a gas selected from a group consisting of Ar, $O_2$, $N_2$, $H_2$, $CH_4$, $C_2H_4$, and $C_xF_y$.

9. The method of claim 8, wherein in step c), the interlayer insulating layer is etched at a pressure of 1 mTorr to 100 mTorr.

* * * * *